(12) United States Patent
Pöltl et al.

(10) Patent No.: US 11,140,768 B2
(45) Date of Patent: Oct. 5, 2021

(54) COMPONENT CARRIER WITH HIGH PASSIVE INTERMODULATION PERFORMANCE

(71) Applicant: AT&S Austria Technologie & Systemtechnik Aktiengesellschaft, Leoben (AT)

(72) Inventors: Kevin Pöltl, St. Anna am Aigen (AT); Rene Oberegger, Paldau (AT); Konrad Klaus, Feldbach (AT); Erich Schlaffer, St. Lorenzen (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/841,394

(22) Filed: Apr. 6, 2020

(65) Prior Publication Data
US 2020/0329552 A1 Oct. 15, 2020

(30) Foreign Application Priority Data
Apr. 10, 2019 (EP) .................................... 19168420

(51) Int. Cl.
| H05K 1/02 | (2006.01) |
| H01Q 1/22 | (2006.01) |
| H05K 3/18 | (2006.01) |
| H05K 3/46 | (2006.01) |

(52) U.S. Cl.
CPC ......... *H05K 1/0216* (2013.01); *H01Q 1/2283* (2013.01); *H05K 3/188* (2013.01); *H05K 3/4658* (2013.01); *H05K 2201/10098* (2013.01)

(58) Field of Classification Search
CPC .................................................... H05K 1/0216
USPC ........................................................ 174/260
See application file for complete search history.

(56) References Cited

U.S. PATENT DOCUMENTS

| 5,689,428 A | 11/1997 | Sauerbrey et al. |
| 5,885,745 A | 3/1999 | Marrocco, III |
| 9,236,338 B2 | 1/2016 | Nakatani et al. |
| 9,439,291 B2 | 9/2016 | Kubota |
| 9,485,874 B2 | 11/2016 | Chen et al. |

(Continued)

FOREIGN PATENT DOCUMENTS

| CN | 104966677 A | 10/2015 |
| CN | 107197598 A | 9/2017 |

(Continued)

OTHER PUBLICATIONS

Extended European Search Report in Application No. 19168420.8; dated Mar. 4, 2020; pp. 1-16; European Patent Office, 80298, Munich, Germany.

(Continued)

*Primary Examiner* — Stanley Tso
(74) *Attorney, Agent, or Firm* — Robert A. Blaha; Smith Tempel Blaha LLC

(57) ABSTRACT

A component carrier which includes a stack having at least one electrically conductive layer structure and at least one electrically insulating layer structure, and electrically conductive wiring structures being part of the at least one electrically conductive layer structure, wherein a value of the passive intermodulation for signals propagating along the electrically conductive wiring structures is less than −153 dBc.

12 Claims, 4 Drawing Sheets

(56) References Cited

U.S. PATENT DOCUMENTS

| | | | |
|---|---|---|---|
| 10,021,762 B1* | 7/2018 | Tsai | H01L 51/56 |
| 2005/0244621 A1 | 11/2005 | Arai et al. | |
| 2005/0253244 A1 | 11/2005 | Chang | |
| 2007/0025092 A1 | 2/2007 | Lee et al. | |
| 2007/0204086 A1 | 8/2007 | Jaroszewski et al. | |
| 2007/0269738 A1 | 11/2007 | Itagaki et al. | |
| 2009/0039496 A1 | 2/2009 | Beer et al. | |
| 2009/0301766 A1 | 12/2009 | Park et al. | |
| 2012/0273941 A1 | 11/2012 | Zeng | |
| 2014/0070396 A1 | 3/2014 | Kyozuka et al. | |
| 2014/0124777 A1 | 5/2014 | Nakatani et al. | |
| 2014/0364996 A1 | 12/2014 | Schmidt | |
| 2015/0030824 A1* | 1/2015 | Crosley | C03C 14/00 428/206 |
| 2015/0040389 A1 | 2/2015 | Ishiguro et al. | |
| 2015/0227042 A1 | 8/2015 | Kubota | |
| 2015/0382473 A1 | 12/2015 | Okamoto et al. | |
| 2016/0007449 A1 | 1/2016 | Kim et al. | |
| 2016/0037637 A1 | 2/2016 | Carlson et al. | |
| 2017/0042026 A1 | 2/2017 | Wu et al. | |
| 2017/0079142 A1 | 3/2017 | Lee et al. | |
| 2020/0161748 A1* | 5/2020 | Isik | H01Q 9/16 |
| 2020/0266337 A1* | 8/2020 | Liu | H01L 43/12 |

FOREIGN PATENT DOCUMENTS

| | | |
|---|---|---|
| CN | 108966515 A | 12/2018 |
| EP | 1 410 906 A1 | 4/2004 |
| EP | 1 622 431 A1 | 2/2006 |
| JP | H0350887 A | 3/1991 |
| JP | H06275950 A | 9/1994 |
| JP | H0818239 A | 1/1996 |
| JP | H1098266 A | 4/1998 |
| JP | H10209644 A | 8/1998 |
| JP | H11212272 A | 8/1999 |
| JP | 2000133935 A | 5/2000 |
| JP | 2004341478 A | 12/2004 |
| JP | 2005037754 A | 2/2005 |
| JP | 2005037755 A | 2/2005 |
| JP | 2013011836 A | 1/2013 |
| JP | 2014203005 A | 10/2014 |
| JP | 2014235391 A | 12/2014 |
| JP | 2015018029 A | 1/2015 |
| JP | 2016034010 A | 3/2016 |
| JP | 2016188921 A | 11/2016 |
| JP | 2016213299 A | 12/2016 |
| JP | 2017005193 A | 1/2017 |
| KR | 20040061258 A | 7/2004 |
| KR | 20130143365 A | 12/2013 |
| TW | 201513753 A | 4/2015 |
| WO | 2014171525 A1 | 10/2014 |
| WO | 2015013129 A1 | 1/2015 |
| WO | 2015041768 A1 | 3/2015 |
| WO | 2015064280 A1 | 5/2015 |
| WO | 2015175197 A1 | 11/2015 |
| WO | 2015177947 A1 | 11/2015 |
| WO | 2016060191 A1 | 4/2016 |
| WO | 2016060237 A1 | 4/2016 |
| WO | 2016158362 A1 | 10/2016 |
| WO | 2017007001 A1 | 1/2017 |
| WO | 2017018299 A1 | 2/2017 |
| WO | 2017019866 A1 | 2/2017 |

OTHER PUBLICATIONS

Ansuinelli, P et al.; PIM Generation by Rough Conductors; 2017, IEEE; pp. 43-46; XP33114784A.

Ansuinelli, P. et al.; Passive Intermodulation Due to Conductor Surface Roughness; IEEE Transactions on Microwave Thoery and Techniques, vol. 66, No. 2, Feb. 2018, pp. 688-699.

Kathrein: "Calculating Passive Intermodulation for Wideband Antenna Arrays"; Kathrein, Jul. 2018; https://www.kathrein.com/cn/solutions/mobile-communication/support/technical-documents/passive-intermodulation/; pp. 1-16.

Anritsu envision:ensure; PIM Test Power Level—REV A; pp. 1-6; printed in the U.S.A. 2017.

Passive RF and microwave devices, intermodulation level measurement—Part 1: General requirements and measuring methods; IEC 62037-1:2012; https://webstore.iec.ch/publication/6331; pp. 1-3; as downloaded on Apr. 1, 2019.

Jung. S; Oberflachenbeurteilung, Rauheitsmessung; ; Spezialisierungsversuch und Hauptversuch; Universität Stuttgart; Institut für Maschinenelemente; pp. 1-18.

* cited by examiner

COMPONENT CARRIER WITH HIGH PASSIVE INTERMODULATION PERFORMANCE

CROSS-REFERENCE TO RELATED APPLICATION

This application claims the benefit of the filing date of the European Patent Application No. 19 168 420.8, filed Apr. 10, 2019, the disclosure of which is hereby incorporated herein by reference.

TECHNICAL FIELD

The invention relates to a component carrier, to a method of manufacturing a component carrier, and to a method of use.

Technological Background

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, artefacts may occur when high-frequency signals propagating along wiring structures of a component carrier mix or multiply with each other to generate distorted signals. This undesired phenomenon may be denoted as passive intermodulation (PIM) and may deteriorate signal transmission over a component carrier. Passive intermodulation can substantially degrade the overall performance of mobile communication systems, etc.

SUMMARY

There may be a need to provide a component carrier with high performance in terms of signal transmission.

This need is achieved by a component carrier, a method of manufacturing a component carrier, and a method of use according to the independent claims.

According to an exemplary embodiment of the invention, a component carrier is provided, wherein the component carrier includes a stack with at least one electrically conductive layer structure and at least one electrically insulating layer structure, and electrically conductive wiring structures being part of the at least one electrically conductive layer structure, wherein a value of the passive intermodulation (PIM) for signals propagating along the electrically conductive wiring structures is less than −153 dBc.

According to another exemplary embodiment of the invention, a method of manufacturing a component carrier is provided, wherein the method comprises forming a stack comprising at least one electrically conductive layer structure and at least one electrically insulating layer structure, and forming electrically conductive wiring structures being part of the at least one electrically conductive layer structure, wherein the electrically conductive wiring structures are formed so that a value of the passive intermodulation (PIM) for signals propagating along the electrically conductive wiring structures is less than −153 dBc.

According to still another exemplary embodiment of the invention, electrically conductive wiring structures of a component carrier having the above-mentioned features are used for a high-frequency application, in particular for conducting a radio frequency (RF) signal, in particular a radio frequency signal with a frequency above 1 GHz.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "passive intermodulation (PIM)" may particularly denote a phenomenon according to which high-frequency signals propagating along wiring structures of a component carrier may mix or multiply with each other to generate other signals that are related to the first ones, and to thereby involve intermodulation distortion. Passive intermodulation can produce undesired interference, and this can even hide the wanted signal. Passive intermodulation may be measured in units of dBc. The parameter "dBc" (decibels relative to the carrier) may denote the power ratio of a signal to a carrier (or reference) signal, ex-pressed in decibels (i.e. on a logarithmic scale). If the dBc figure is negative, then the relative signal strength is less than carrier signal strength. In other words, a more negative dBc value may indicate a better performance of the component carrier than a less negative dBc value. Passive intermodulation may be measured in accordance with the standard IEC 62037 (in particular in the latest version as in force at the priority date of the present patent application). For example, a measurement of passive intermodulation may be carried out as disclosed in the white paper "Calculating Passive Intermodulation for Wideband Antenna Arrays", Kathrein, July 2018, which can be downloaded via "https://www.kathrein.com/cn/solutions/mobile-communication/support/technical-documents/passive-intermodulation/".

In the context of the present application, the term "high-frequency application" may particularly denote a task fulfilled by the component carrier or to which the component carrier contributes, wherein the task may relate to the handling of a radio-frequency signal. Such a radio or high-frequency signal may be an electric or electromagnetic signal propagating along the wiring structure in a range of frequencies used for communications or other signals. In particular, a radio-frequency (RF) signal may for example have a frequency in the range between 3 kHz and 300 GHz.

According to an exemplary embodiment of the invention, a component carrier with electrically conductive wiring structures or electrically conductive traces is provided and having a value of the passive intermodulation of below −153 dBc. It has turned out that by taking one or more appropriate measures such as the provision of the electrically conductive wiring structures with a sufficiently smooth surface, the use of an appropriate surface finisher, a proper patterning procedure, and/or the use of an adhesion promoter rather than surface roughening, etc., a component carrier can transmit or conduct high-frequency signals with low loss caused by frequency mixing and/or multiplication. Such electrically conductive wiring structures may also fulfil a PIM design rule of −153 dBc, i.e., a PIM related signal loss of less than −153 dB per centimeter signal transmission length or wiring structure length. Thus, distortions due to interference between different radiofrequency signals during signal transmission can be strongly suppressed according to exemplary embodiments. In particular the risk of signal distortions in high-frequency applications (such as 5G) can therefore be rendered highly unlikely, and a high signal strength and signal quality may be obtained.

In the following, further exemplary embodiments of the component carrier and the methods will be explained.

In an embodiment, the electrically conductive wiring structures form an antenna structure. In the context of the present application, the term "antenna structure" may particularly denote an electrically conductive structure shaped, dimensioned and configured to be capable of receiving and/or transmitting electromagnetic radiation signals corresponding to electric or electromagnetic signals which may be conducted along the electrically conductive wiring structures of the component carrier. However, it is alternatively also possible that the component carrier only transmits signals along the wiring structures, without necessarily having an antenna structure.

In an embodiment, the value of the passive intermodulation (PIM) is less than −155 dBc, in particular less than −160 dBc, more particularly less than −165 dBc, and preferably less than −168 dBc. By taking the various measures described herein, it may even be possible to meet the even more strict design rule of the PIM value, see the figures above.

The roughness of a surface may be defined as and may be measured as the centerline average height Ra. Ra is the arithmetic mean value of all distances of the profile from the centerline. The roughness of a surface may however also be defined as and may be measured as average roughness depth Rz. Rz can be determined when a reference length is sampled from a roughness curve in a direction of a mean line, and may denote the distance between the top profile peak line and the bottom profile valley line on this sampled portion as measured in the longitudinal direction of the roughness curve (for instance, Rz may be determined by averaging over five individual measuring paths). For instance, the measurement or determination of roughness Ra and Rz may be carried out according to DIN EN ISO 4287:2010.

In an embodiment, at least a part of an exterior surface of the electrically conductive wiring structures has a roughness Rz of less than 300 nm, in particular less than 200 nm. It has turned out that providing at least part of the surface of the electrically conductive wiring structures with the mentioned high smoothness or low roughness properties allows obtaining remarkably advantageous properties in terms of PIM behavior.

In an embodiment, a horizontal (i.e., an upper and/or lower) surface of the electrically conductive wiring structures has a roughness Rz of less than 300 nm, in particular less than 200 nm. The upper or lower surface may be a surface of the wiring structures parallel to main surfaces of the component carrier or stack. It has turned out that in particular the upper surface has a high impact on the PIM behavior.

In an embodiment, an entire surface of a plating portion of the electrically conductive wiring structures (which may be combined as a foil portion and a plating portion) has a roughness Rz of less than 300 nm, in particular less than 200 nm. In particular an upper and/or lower surface as well as at least part of side surfaces of the plating portion may be formed with the mentioned highly smooth surface properties in order to improve the PIM behavior.

In an embodiment, a surface of an electrically conductive base structure (such as a foil portion) of the electrically conductive wiring structures below a plating portion of the electrically conductive wiring structures has a roughness Rz of less than 1.6 μm, in particular less than 1 μm. Hence, also a relatively smooth base structure, such as a copper foil, may be used for forming the electrically conductive wiring structures. This smooth base structure has also positive impact on the PIM behavior. As an alternative to the provision of a laminated copper foil as base structure, it is also possible to form such a base structure by sputtering electrically conductive material such as copper, for instance on the electrically insulating layer structure.

The mentioned roughness values are compatible with a low loss transmission of radiofrequency signals through the wiring structures or wiring structure, since no excessive surface roughness deteriorates signal propagation under consideration of the skin effect. According to the skin effect, an electric signal with a high-frequency, for instance in the gigahertz range, does not propagate over an entire cross-section of a conductor, but propagates substantially only within a skin-like surface portion thereof. This may conventionally cause significant signal losses with roughened surfaces. Without wishing to be bound to a specific theory, it is presently believed that such signal losses may result from an additional electric resistance or impedance which the traveling radiofrequency signal suffers as a consequence of a micro roughening of a surface. Advantageously, such signal losses can be prevented or at least strongly suppressed when reducing roughness of electrically conductive wiring structures of a component carrier.

In an embodiment, the component carrier comprises a surface finish covering at least part of the electrically conductive wiring structures. Forming one or more surface finishes on component carriers, like printed circuit boards (PCB), is an efficient measure to protect an electrically conductive structure of the component carrier. The electrically conductive structure usually comprises an electrically conductive material like copper which, when it is left unprotected, may oxidize and thereby leads to deterioration of the component carrier. Thus, the surface finish is formed on the electrically conductive wiring structure, which has two major functions: to protect the electrically conductive wiring structure from oxidation and to provide an electrically connectable surface for electrical components to be assembled to the component carrier.

In an embodiment, the surface finish comprises or consists of tin, in particular chemical tin or immersion tin. However, galvanic tin or hot air leveling (which may also comprise tin) may also be used as material of the surface finish. In different embodiments, hot air leveling may be implemented with lead or lead-free. It has turned out that surprisingly a tin-based surface finish and in particular chemical tin significantly promotes the PIM behavior of the electrically conductive wiring structures of the component carrier. Surprisingly, chemical tin properly adheres even on a highly smooth surface of the electrically conductive wiring structures.

However, other surface finishes like electroless nickel immersion gold (ENIG) may be used as well.

In an embodiment, at least part of a surface of the electrically conductive wiring structures is covered with an adhesion promoter. By chemically promoting adhesion of component carrier material on the surface of the electrically conductive wiring structures rather than roughening the surface of the wiring structures mechanically, proper adhesion may be promoted and suppression of delamination may be thereby achieved while simultaneously obtaining a significant reduction of signal attenuation by suppressing passive intermodulation.

In an embodiment, the stack comprises a central electrically insulating layer structure covered on both opposing main surfaces thereof with a respective one of the at least one electrically conductive layer structure. For instance, such as stack may be a core. Such a core may have a central dielectric layer which may comprise resin, optionally comprising reinforcing particles such as glass fibers. For instance, the central dielectric layer may be a prepreg player. The central dielectric layer may be covered on both opposing main surfaces with a respective copper foil or the like.

In an embodiment, the stack comprises at least one through hole being at least partially filled with an electrically conductive filling medium (such as plated copper) for electrically connecting opposing main surfaces of the stack. For instance, the through hole may be formed by laser processing or by mechanically drilling. The filling medium may be copper which may be inserted into the through hole for example by electroless deposition and/or plating. With such a plated via, a short vertical connection path between the two opposing main surfaces of the component carrier may be obtained which also suppresses signal loss.

In an embodiment, the electrically conductive wiring structures comprise a base structure (in particular on the at least one electrically insulating layer structure) and comprise a plated structure (i.e., an electrically conductive structure formed by plating) on the base structure. Thus, the wiring structures may be configured as a metallic composite material, in particular metallic layer stack. It has turned out that with the formation of the wiring structures as a foil-type base structure and a plated structure thereon, a high smoothness of the wiring structures may be obtained with low effort. This may, in turn, result in a low loss during radiofrequency transport along a corresponding wiring structure.

In an embodiment, the base structure is a patterned metal foil, in particular a patterned copper foil. For instance, the base structure has a thick-ness in a range between 5 μm and 30 μm. With such a small thickness, a compact component carrier may be obtained.

In an embodiment, the plated structure is a plated copper structure, i.e. formed by copper plating. For instance, the plated structure has a thickness in a range between 20 μm and 70 μm. With such a small thick-ness, a compact component carrier may be obtained.

In an embodiment, the plated structure comprises at least two stacked plating layers, in particular is configured as a double plating layer. Plating may be carried out partially before and partially after formation of a patterned etch resist. The mentioned patterning procedure has also turned out to have a positive impact on the PIM behavior of the component carrier.

In an embodiment, the method comprises attaching, in particular laminating, a metal foil as the base structure (or as a preform of the base structure) to the at least one electrically insulating layer structure. By patterning, the metal foil may be converted from the preform to the final base structure.

In an embodiment, the method comprises plating electrically conductive material as the plated structure (or as a preform of the plated structure) on the base structure or preform of the base structure. By patterning at least part of the plated material, the plated material may be converted from the preform to the final plated structure.

In an embodiment, the method comprises forming the plated structure as a first plating layer on the base structure and a second plating layer on the first plating layer, wherein the first plating layer and the second plating layer are formed in separate plating procedures. In particular, the method may comprise forming the first plating layer on the base structure before applying an etch resist, and forming the second plating layer on the first plating layer after applying the etch resist. Advantageously, the method may comprise commonly etching only the first plating layer and the base structure together with an etch resist thereon, after having applied the etch resist. More specifically, the second plating layer may be arranged and deposited selectively in openings between portions of the patterned etch resist, but not on the portions of the etch resist. It is also possible that the method comprises applying an etch protection selectively to the second plating layer, but not on portions of the etch resist, before etching. An etch protection may thus be applied selectively onto the exposed surface portions of the second plating layer, but not on the etch resist in between. By a subsequent etching procedure, the etch resist and the portions of the first plating layer and the base structure (or its preform) below the etch resist may be removed. In contrast to this, the surface portions corresponding to the etch protection (together with portions of the base structure, of the first plating layer and of the second plating layer beneath a respective portion of the etch protection) may remain present during the etching procedure to thereby define portions of the electrically conductive wiring structures.

In an embodiment, the method comprises forming the first plating layer by flash plating. Initially (i.e. before forming the second plating layer), a plating deposit in form of the first plating layer and denoted as flash plating layer may be used to form a very thin (for instance less than 0.1 μm thick) plating with high quality and good adherence to the base structure (or its preform). This serves as a foundation for a subsequent plating process for forming the second plating layer. A strike uses a high current density and a bath with a low ion concentration may be used for flash plating. It has turned out that the described two-stage plating procedure also has a positive impact on the PIM behavior of the component carrier, since this may promote formation of a wiring structure with high smoothness.

In an embodiment, the component carrier is used for 5G. Mobile wireless communication according to the 5G standard involves high-frequency transmission with a high transmitted data volume per time and therefore requires excellent properties in terms of PIM behavior. A component carrier according to an exemplary embodiment of the invention with a PIM characteristic of less than −153 dBc or even less than −160 dBc meets these demanding requirements. Fifth generation (5G) networks feature an increased mobile data rate, in particular significantly above 100 Mb/s. This higher transmission rate may expose PIM vulnerabilities in communication networks. Fifth generation communication networks can experience superior network transmission fidelity when implementing a component carrier according to an exemplary embodiment of the invention.

In an embodiment, the component carrier is used for high-frequency applications above 1 GHz, in particular about 100 GHz. In particular for such high frequencies, signal transmission is particularly sensitive to surface roughness caused artefacts in view of the skin effect. The high PIM performance of component carriers according to exemplary embodiments of the invention allows low loss signal transmission even with such high-frequency values.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carrier is configured as one of a group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as rein-forced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of a group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier further comprises an electronic component mounted on and/or embedded in the component carrier material, in particular in the stack. For instance, the electronic component may be a radiofrequency semiconductor chip configured for emitting and/or receiving radiofrequency signals via the wiring structures and being electrically coupled with the electrically conductive wiring structures. Hence, the electronic component may be configured for executing a radio frequency application, in particular a radio frequency application involving frequencies above 1 GHz.

At least one component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a dynamic random access memory (DRAM) or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
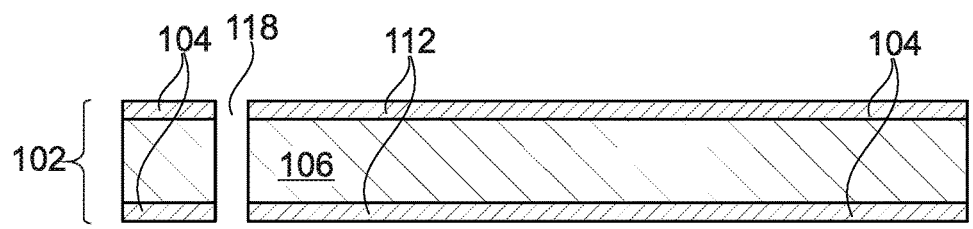
FIG. 1, FIG. 2, FIG. 3, FIG. 4, FIG. 5 and FIG. 6 illustrate cross-sectional views of structures obtained during performance of a method of manufacturing a component carrier according to an exemplary embodiment of the invention, shown in a cross-sectional view in FIG. 7.

The illustrations in the drawings are schematically presented. In different drawings, similar or identical elements are provided with the same reference signs.

Before referring to the drawings, exemplary embodiments will be de-scribed in further detail, some basic considerations will be summarized based on which exemplary embodiments of the invention have been developed.

According to an exemplary embodiment of the invention, a component carrier (in particular a printed circuit board, PCB) for an antenna application with a PIM value of below −153 dBc, preferably below −160 dBc, is provided. Such a unique PIM performance may be obtained, for instance, by ensuring a low roughness of a base structure (such as a copper foil) and a very low roughness of a plated structure formed by pattern plating on such a base structure. By properly controlling the roughness of electrically conductive wiring structures on their (in particular rising and/or falling) edges and/or on their top and/or bottom surface, preferably in combination with a chemical tin type surface finish on a top and/or bottom surface of the electrically conductive wiring structures has turned out as an efficient way of reducing the PIM losses in the described way. This may in particular allow preventing interruptions of communication due to interruptions of data transmission caused by a component carrier. Furthermore, fluctuations of transmission quality during wireless communication involving the component carrier may be reduced.

For instance, such an architecture allows manufacturing component carriers with an antenna being suitable for demanding high-frequency applications, as required for instance by 4G or 5G. More specifically, the component carrier may be used for mobile applications, automotive applications (in particular car-to-car applications), cloud applications, fog applications, Internet-of-Things (IOT) applications, etc.

Figure 5:
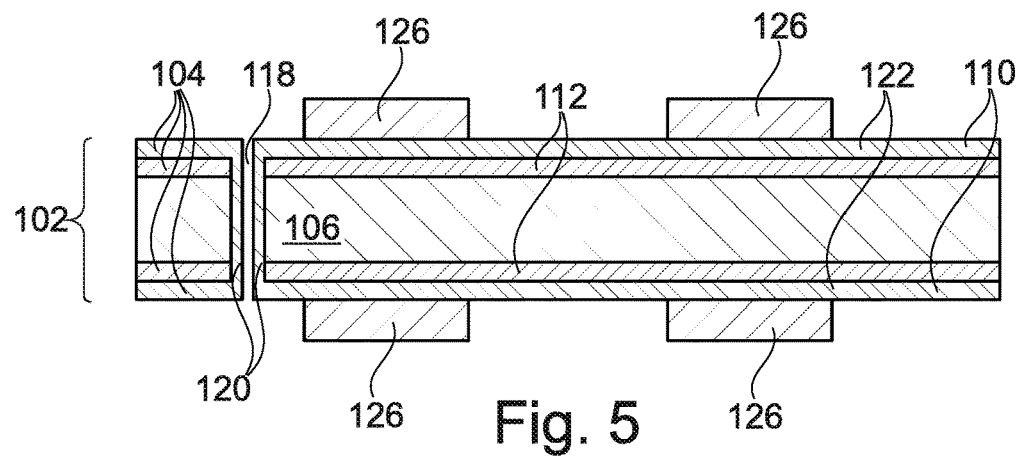
Figure 6:
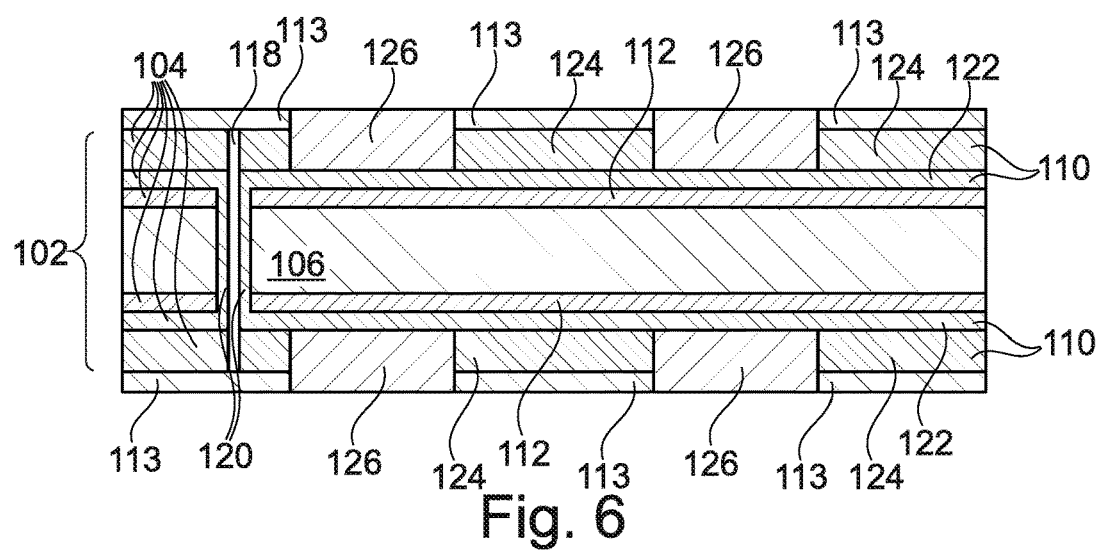
Figure 7:
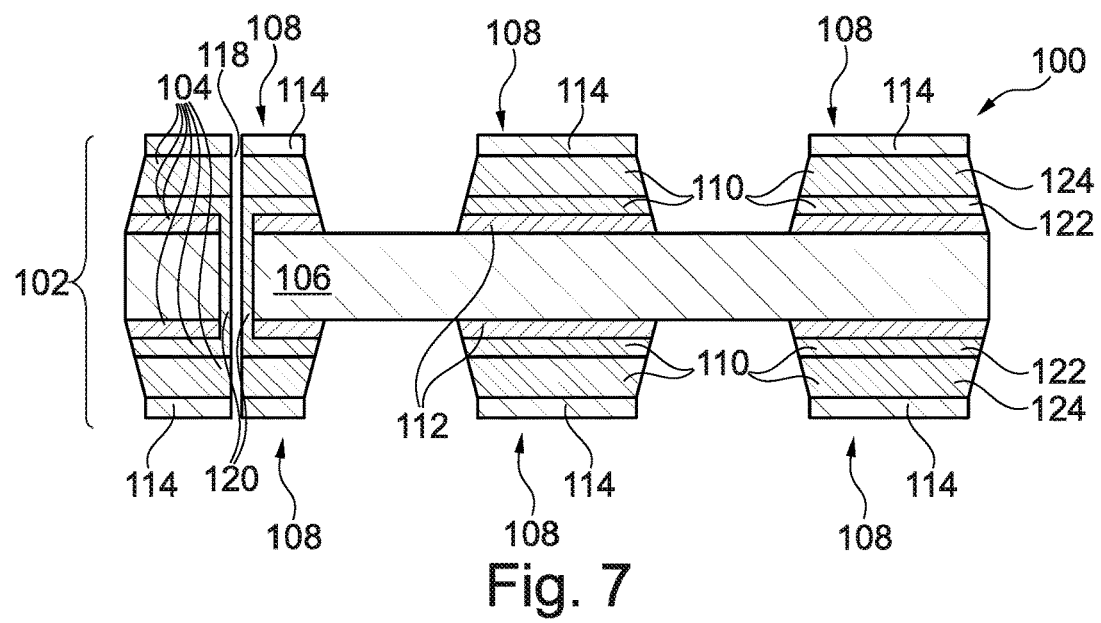

FIG. 1 to FIG. 7 illustrate cross-sectional views of structures obtained during carrying out a method of manufacturing a component carrier 100 according to an exemplary embodiment of the invention, shown in FIG. 7.

Referring to FIG. 1, a stack 102 is provided which comprises two electrically conductive layer structures 104 on both opposing main surfaces of a central electrically insulating layer structure 106. The electrically insulating layer structure 106 may for instance comprise resin (such as epoxy resin), optionally comprising reinforcing particles such as glass fibers. For instance, the electrically insulating layer structure 106 may be made of prepreg. The two electrically conductive layer structures 104 may be copper layers laminated onto the opposing main surfaces of the electrically insulating layer structure 106. For instance, the stack 102 may be a fully cured core with laminated copper foils.

The electrically conductive layer structures 104 serve as preform of base structures 112 which, in turn, later form part of electrically conductive wiring structures 108 with highly appropriate passive intermodulation (PIM) behavior. The preform of the base structure 112 on each of the top main surface and the bottom main surface of the electrically insulating layer structure 106 may have a very small thickness in a range between 5 µm and 30 µm. Preferably, the surface of the preforms of the electrically conductive base structures 112 facing the electrically insulating layer structure 106 (i.e. the lower main surface of the upper preform of the electrically conductive base structure 112 and the upper main surface of the lower preform of the electrically conductive base structure 112) is selected to have a low roughness Rz of less than 1 µm. The roughness between electrically insulating layer structure 106 and electrically conductive base structure 112 may also be denoted as treatment roughness. This will have a positive impact on the PIM properties of the readily manufactured component carrier 100.

FIG. 1 furthermore shows that one or more through holes 118 may be formed in the stack 102 to extend vertically through the entire stack 102. The through hole 118 may be formed by mechanically drilling, laser drilling, etc. and may later serve for electrically connecting electrically conductive wiring structures 108 on the opposing main surfaces of the stack 102 with a short path length. Such a short connection path for propagating electric signals may suppress signal distortion.

Figure 2:
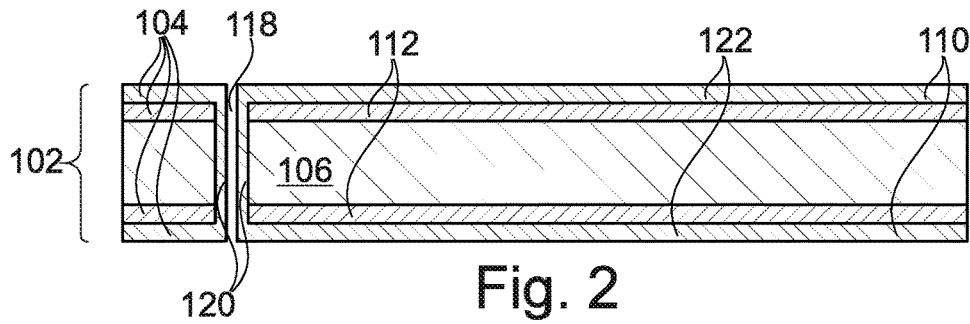

Referring to FIG. 2, a flash plating procedure may be carried out for depositing further copper material on the exposed surfaces of the preforms of the base structures 112. As a result, a further constituent of the electrically conductive wiring structures 108 may be formed in form of preforms of plated structures 110 deposited on the preforms of the base structures 112. More precisely, the flash plating procedure according to FIG. 2 only forms part of entire plated structures 110, namely forms a pre-form of first plating layers 122 of the plated structures 110 on the previously formed preforms of the base structures 112. Second plating layers 124 of the plated structures 110 will be formed later, as described below referring to FIG. 6.

Moreover, the described flash plating procedure also deposits electrically conductive material (more specifically copper) on the vertical walls of the stack 102 delimiting the through hole 118. Thereby, the through hole 118 is filled partially (or alternatively entirely) with electrically conductive filling medium 120 for electrically connecting the opposing main surfaces of the stack 102.

In order to promote adhesion, it is also possible to apply a chemical adhesion promoter (not shown) on the preforms of the base structures 112 prior to the plating of the preforms of the first plating layers 122.

Figure 3:
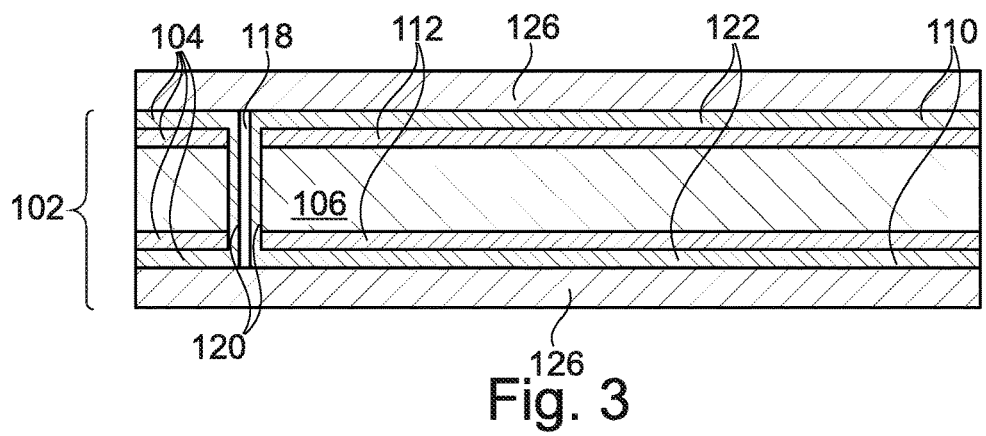

Referring to FIG. 3, an etch resist 126 (such as a photoresist) is applied (in particular by lamination) to both opposing main surfaces of the extended stack 102 shown in FIG. 2. Thus, the preforms of the first plating layers 122 on the preforms of the base structures 112 are covered by the etch resist 126.

Figure 4:
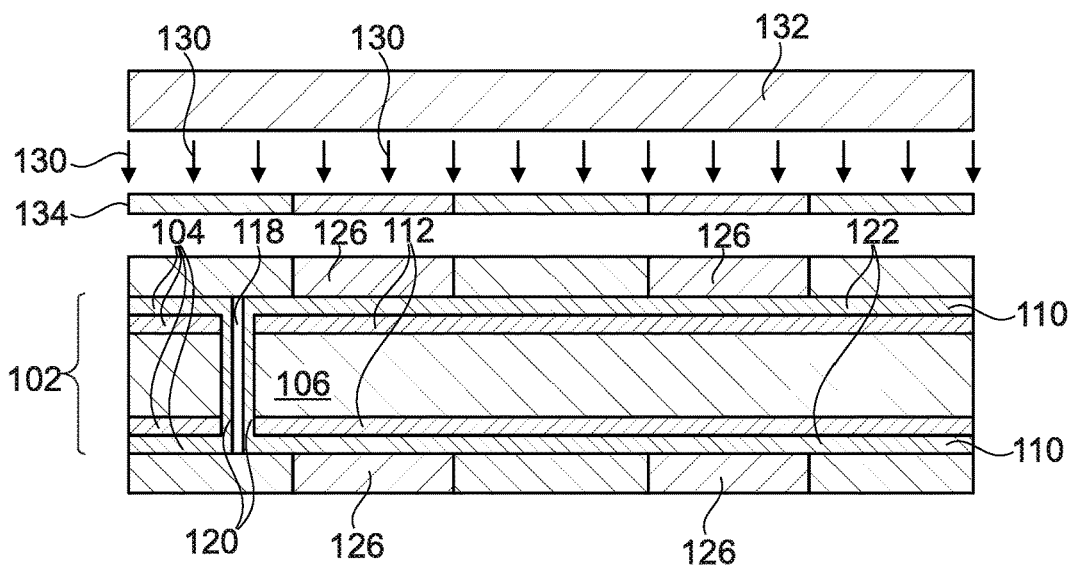

Referring to FIG. 4, specific portions of the etch resist 126 on both opposing main surfaces of the structure shown in FIG. 3 are exposed to electromagnetic radiation 130 generated by an electromagnetic radiation source 132. The electromagnetic radiation source 132 may for instance be a laser source configured for generating laser light, such as ultraviolet laser light or visible laser light. A mask 134 (such as a film mask) having alternating transparent and opaque portions can be arranged between the electromagnetic radiation source 132 and the structure shown in FIG. 3 for exposure.

Referring to FIG. 5, the result of a developing procedure is illustrated. As a result of the illumination of only selected portions of the etch resist 126 with electromagnetic radiation 130, only illuminated portions of the etch resist 126 remain on the stack 102, whereas non-illuminated portions of the etch resist 126 can be removed by stripping, etching or the like. As a result, a patterned etch resist 126 remains on both opposing main surfaces of the stack 102.

Alternatively, it is also possible that the material of the etch resist 126 is selected so that, as a result of the illumination of only selected portions of the etch resist 126 with electromagnetic radiation 130, only non-illuminated portions of the etch resist 126 remain on the stack 102, whereas illuminated portions of the etch resist 126 can be removed by stripping, etching or the like.

Referring to FIG. 6, the structure shown in FIG. 5 is firstly made subject to a further plating procedure and is subsequently made subject to a surface finish deposition procedure.

Thus, the method comprises continuing formation of the plated structure 110 by plating second plating layers 124 selectively on exposed surface portions of the preforms of the first plating layer 122, i.e., surface portions of the first plating layers 122 being not covered by the remaining portions of the patterned etch resist 126. For instance, formation of the second plating layers 124 may be carried out by galvanic plating. Thus, the second plating layers 124 are formed only on specific surface portions of the preforms of the first plating layers 122 between remaining portions of the etch resist 126. Hence, the shown preform of the plated structure 110 comprises two stacked plating layers 122, 124 and is thus embodied as a double plating layer. Exposed portions of the dielectric etch resist 126 will not be covered by copper material of the second plating layers 124. As can be taken from FIG. 6 and FIG. 2, the preforms of the first plating layers 122 on the one hand and the second plating layers 124 on the other hand are formed in separate plating procedures. The preform of the plated structure 110 may have an overall very small thickness in a range between 20 μm and 70 μm.

After having formed the patterned second plating layers 124, an etch protection 113 is deposited selectively on exposed surface portions of the second plating layers 124. Material of the etch protection 113 will not be deposited on exposed surface portions of the dielectric etch resist 126.

In order to promote adhesion, it is also possible to apply a chemical adhesion promoter (not shown) on the exposed surfaces of the preforms of the first plating layers 122 prior to the plating of the second plating layers 124. In order to additionally promote adhesion, it is also possible to apply a chemical adhesion promoter (not shown) on the exposed surfaces of the second plating layers 124 prior to the deposition of the etch protection 113.

Referring to FIG. 7, etching and stripping may be carried out. More specifically, the method comprises commonly etching away the etch resist 126, the portions of the preforms of the first plating layers 122 below the etch resist 126 and portions of the preforms of the base structures 112 below said portions of the preforms of the first plating layers 122. No etching of the etch protection 113 and the corresponding portions of the layer structures 112, 122 and 124 beneath the etch protection 113 occurs. As a result, patterning of the layer structures on the two opposing main surfaces of electrically insulating layer structure 106 is carried out according to FIG. 7. As a result, electrically conductive traces composed of portions of base structure 112, plated structure 110 (composed of first plating layer 122 and second plating layer 124) and of etch protection 113 are formed. The described patterning procedure may be adjusted in such a way that an antenna structure is formed by the electrically conductive wiring structures 108.

The etch protection 113 may then be removed. A surface finish 114 may then be formed on top of the electrically conductive wiring structures 108. Preferably, the surface finish 114 is made of chemical tin. Surprisingly, chemical tin has turned out to be capable of properly adhering on a very smooth copper surface, and thus also on the exposed main surfaces of the second plating layers 124 which may preferably have a very small roughness Rz of less than 200 nm. However, galvanic tin or hot air leveling may also be used as material of the surface finish 114.

The described plating procedures may be carried out in such a way that at least part of the surface of the electrically conductive wiring structures 108 has a roughness Rz of preferably less than 200 nm. In particular, the surface portions of the electrically conductive wiring structures 108 relating to the (for instance slanted) sidewalls and/or the surface portions of the electrically conductive wiring structure 108 opposing the electrically insulating layer structure 106 may have a roughness Rz of preferably less than 200 nm. The surface portions of the electrically conductive wiring structures 108 facing the electrically insulating layer structure 106 may have a low roughness Rz of less than 1 μm. It has turned out that this smoothness of the electrically conductive wiring structures 108 has a highly positive impact on the PIM behavior of the obtained component carrier 100. In particular in view of the low surface roughness of the electrically conductive wiring structures 108 and the specific selection of the surface finish 114, electrically conductive wiring structures 108 are obtained ensuring that the value of the passive intermodulation PIM for electric high-frequency signals propagating along the electrically conductive wiring structures 108 may be less than −160 dBc. Thus, a component carrier 100 according to an exemplary embodiment of the invention with excellent PIM performance and thus a proper capability of transporting radiofrequency signals with low signal loss can be obtained.

The obtained component carrier 100 is embodied as a plate-shaped laminate-type printed circuit board (PCB) with excellent PIM behavior. The component carrier 100 is composed of the stack 102 of electrically conductive layer structures 104 on both opposing main surfaces of the central electrically insulating layer structure 106. Electrically conductive wiring structures 108 forming part of the electrically conductive layer structures 104 form an antenna structure and are configured for high frequency signal transport on both opposing main surfaces of the electrically insulating layer structure 106. The chemical tin type surface finish 114 covers exposed upper and lower surfaces of the electrically conductive wiring structures 108. Via the plated through hole(s) 118, high-frequency signals may propagate along a very short and thus low loss path between the two opposing main surfaces of the electrically insulating layer structure 106.

Figure 8:
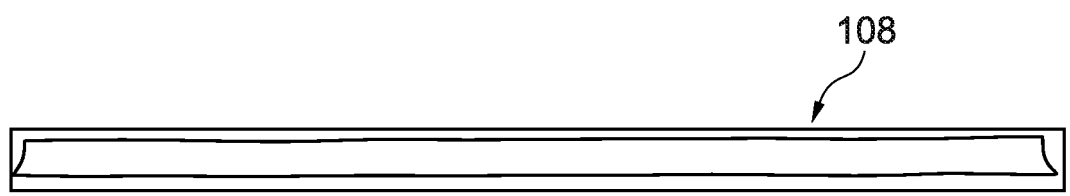
FIG. 8 illustrates an electrically conductive wiring structure of a component carrier according to an exemplary embodiment of the invention obtained by PIM structuring.
Figure 9:
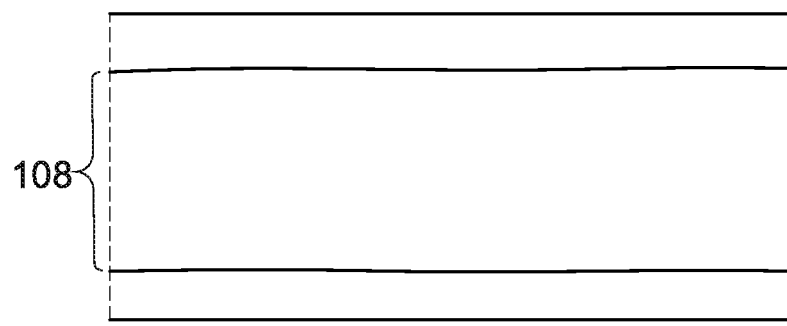
FIG. 9 illustrates a detail of the electrically conductive wiring structure of FIG. 8 obtained by PIM structuring and shows that the roughness Rz of a surface of the wiring structure can assume a very small value of less than 200 nm.

FIG. 8 illustrates an electrically conductive wiring structure 108 of a component carrier 100 according to an exemplary embodiment of the invention formed by PIM structuring. FIG. 9 illustrates a detail of the electrically conductive wiring structure 108 of FIG. 8 obtained by PIM structuring and shows that the roughness Rz of a surface of the wiring structure 108 can assume a very small value of less than 200 nm.

Figure 10:
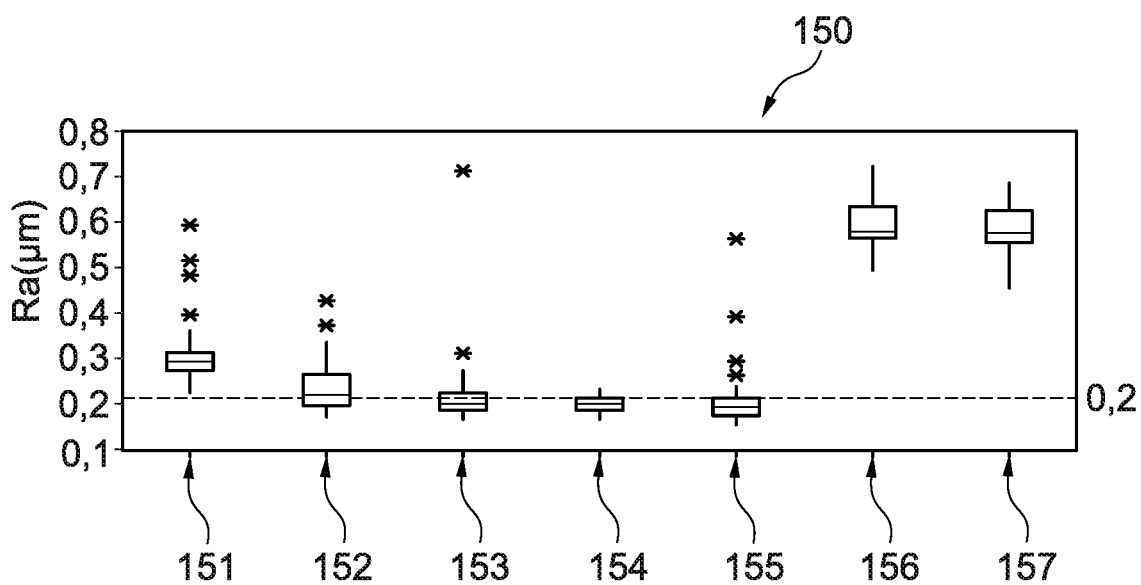
FIG. 10 illustrates a diagram showing values of the roughness Ra of electrically conductive wiring structures of component carriers according to exemplary embodiments of the invention in comparison to conventional component carriers.

FIG. 10 illustrates a diagram 150 showing values of the roughness Ra of electrically conductive wiring structures 108 of component carriers 100 according to exemplary embodiments of the invention in comparison to conventional component carriers.

Reference numeral 151 relates to an exemplary embodiment of the invention using tin as surface finish 114. Reference numeral 152 relates to another exemplary embodiment of the invention using NaPs as surface finish 114. Reference numeral 153 relates to still another exemplary embodiment of the invention using SiT as surface finish 114. Reference numeral 154 relates to yet another exemplary embodiment of the invention using electroless nickel immersion gold (ENIG) as surface finish 114. Reference numeral 155 relates to still another exemplary embodiment of the invention using copper.

Reference numeral 156 relates to a conventional approach without the above described plating and patterning procedure and using ENIG as surface finish. Reference numeral 157 relates to another conventional approach without the above described patterning procedure and using standard copper.

As can be taken from diagram 150, only the five exemplary embodiments of the invention allow obtaining a roughness Ra around an advantageous value of 200 nm. In contrast to this, the conventional approaches fail to obtain a sufficiently low roughness and do not show a sufficient PIM behavior.

Figure 11:
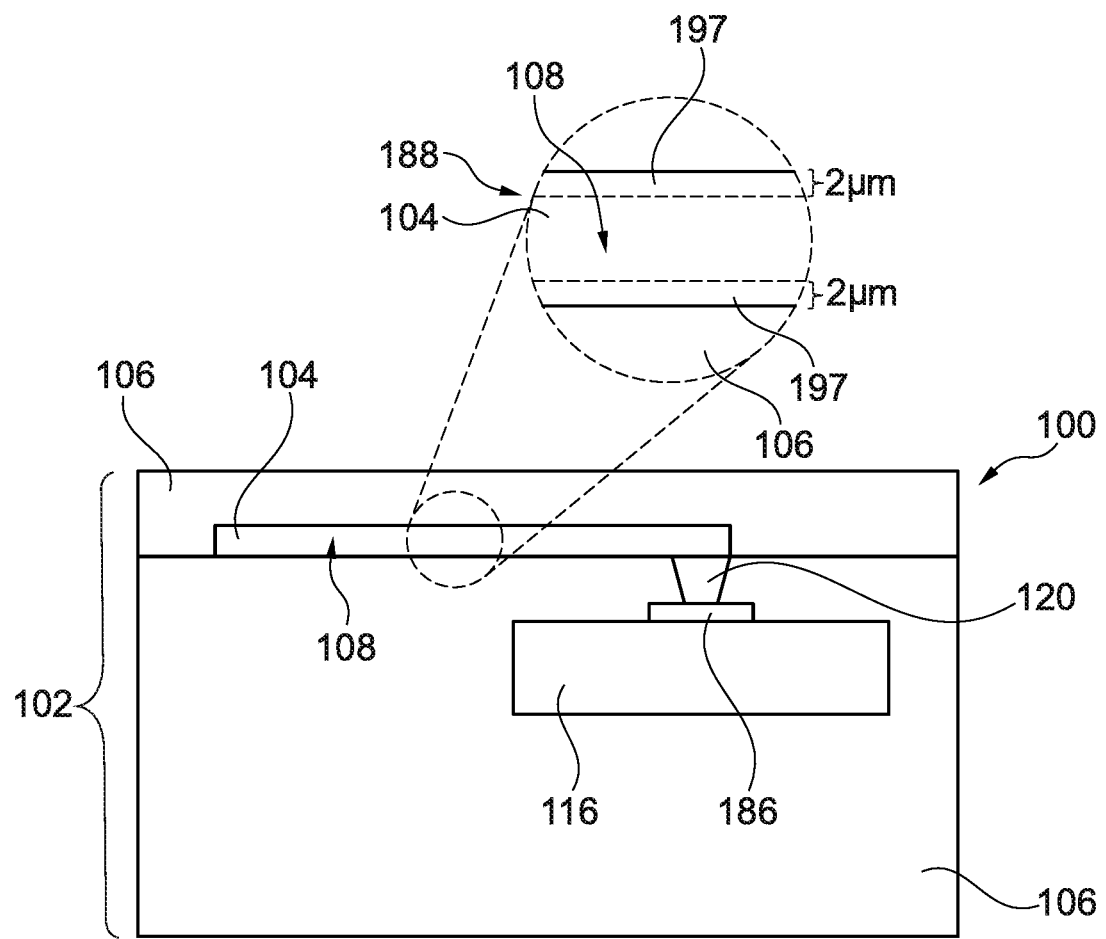
FIG. 11 illustrates a component carrier configured for carrying out a radio frequency application according to an exemplary embodiment of the invention.

FIG. 11 illustrates a component carrier 100 configured for carrying out a radio-frequency application according to an exemplary embodiment of the invention.

In the component carrier 100 shown in a cross-sectional view in FIG. 11, an electronic component 116 is embedded in the stack 102 and is connected to copper wiring structures 108 between prepreg layer structures 106 via a pad 186 and a copper filled via as vertical through connection or electrically conductive filling medium 120. The wiring structures 108 are embedded in dielectric material of the electrically insulating layer structures 106. The wiring structures 108 have been formed by a method corresponding to the one described referring to FIG. 1 to FIG. 7. A detail 188 shows a portion of the wiring structures 108 from above, wherein the wiring structures 108 may be configured for example with a geometry similar to FIG. 7 and with smooth (i.e., low roughness) walls. In the shown embodiment, the electronic component 116 may be a semiconductor chip configured for executing a radio-frequency application by transmitting electric signals via the wiring structures 108 having frequencies of for example 10 GHz or more.

Due to the skin effect, electronic signals with very high frequencies will propagate substantially only within a thin skin surface 197 of the electrically conductive wiring structures 108. Thickness of the skin surface 197 depends, inter alia, on the frequency but may be in the order of magnitude of 2 μm. A roughened surface, which is conventionally used for promoting adhesion of a wiring structure to surrounding dielectric material involves microstructures in the same order of magnitude of few micrometers and can therefore disturb the propagation of radiofrequency signals. In contrast to this, the wiring structures 108 of the component carrier 100 according to an exemplary embodiment of the invention accomplishes improvement of surface adhesion by the above-described adhesion promoter and can therefore render a roughening procedure dispensable. Surfaces of the wiring structures 108 may therefore be provided with very small roughness. This reduces losses of the electric radiofrequency signal.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a stack including at least one electrically conductive layer structure and at least one electrically insulating layer structure;
   electrically conductive wiring structures being part of the at least one electrically conductive layer structure;
   wherein a roughness of a horizontal surface of the electrically conductive wiring structures has an impact on a value of a passive intermodulation for signals propagating along the electrically conductive wiring structures, wherein the roughness of a horizontal surface of the electrically conductive wiring structures is less than 300 nm so that the value of the passive intermodulation is less than −153 dBc;

wherein the electrically conductive wiring structures include an electrically conductive base structure and a plated structure on the base structure;

wherein a surface of the electrically conductive base structure below the plated structure has a roughness Rz of less than 1.6 µm.

2. The component carrier according to claim 1, wherein the value of the passive intermodulation is less than −155 dBc.

3. The component carrier according to claim 1, comprising at least one of the following features:

wherein an entire surface of a plated structure of the electrically conductive wiring structures has a roughness Rz of less than 300 nm.

4. The component carrier according to claim 1, comprising at least one of the following features:

wherein a surface finish covering at least part of the electrically conductive wiring structures, wherein the surface finish comprises or consists of tin;

wherein at least part of a surface of the electrically conductive wiring structures is covered with an adhesion promoter;

wherein at least one electronic component mounted on or embedded in the stack and being electrically coupled with the electrically conductive wiring structures;

wherein the stack includes a central electrically insulating layer structure covered on both opposing main surfaces thereof with a respective electrically conductive layer structure;

wherein the stack includes at least one through hole extending vertically through the at least one electrically insulating layer structure and being at least partially filled with an electrically conductive filling medium for electrically connecting electrically conductive wiring structures on both opposing main surfaces of the at least one electrically insulating layer structure.

5. The component carrier according to claim 1, comprising at least one of the following features:

wherein the base structure is a patterned metal foil;

wherein the base structure has a thickness in a range between 5 µm and 30 µm;

wherein the plated structure is a plated copper structure;

wherein the plated structure comprises at least two stacked plating layers;

wherein the plated structure has a thickness in a range between 20 µm and 70 µm.

6. The component carrier according to claim 1, comprising at least one of the following features:

wherein the electrically conductive wiring structures form an antenna structure;

wherein at least one component being surface mounted on or embedded in the component carrier, wherein the at least one component is selected from a group consisting of an electronic component, an electrically non-conductive or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein the at least one electrically conductive layer structure comprises at least one of a group consisting of copper, aluminum, nickel, silver, gold, palladium, and tungsten, any of the mentioned materials being optionally coated with supra-conductive material such as graphene;

wherein the at least one electrically insulating layer structure comprises at least one of the group consisting of resin, epoxy resin, Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;

wherein the component carrier is shaped as a plate;

wherein the component carrier is configured as one of a group consisting of a printed circuit board, and a substrate;

wherein the component carrier is configured as a laminate-type component carrier.

7. A method of manufacturing a component carrier, comprising:

forming a stack including at least one electrically conductive layer structure and at least one electrically insulating layer structure; and forming electrically conductive wiring structures being part of the at least one electrically conductive layer structure;

wherein a roughness of a horizontal surface of the electrically conductive wiring structures has an impact on a value of a passive intermodulation for signals propagating along the electrically conductive wiring structures, wherein the roughness of a horizontal surface of the electrically conductive wiring structures is less than 300 nm so that the value of passive intermodulation is less than −153 dBc;

wherein the electrically conductive wiring structures include an electrically conductive base structure and a plated structure on the base structure;

wherein a surface of the electrically conductive base structure below the plated structure has a roughness Rz of less than 1.6 µm.

8. The method according to claim 7, comprising at least one of the following features:

wherein the method includes attaching a metal foil as the base structure or as a preform of the base structure to the at least one electrically insulating layer structure;

wherein the method includes plating electrically conductive material as the plated structure or as a preform of the plated structure on the base structure or on a preform of the base structure.

9. The method according to claim 7, wherein the method includes forming the plated structure with a first plating layer on the base structure and with a second plating layer on the first plating layer, wherein the first plating layer and the second plating layer are formed in separate plating procedures.

10. The method according to claim 9, comprising at least one of the following features:

wherein the method includes plating the first plating layer on the base structure before applying an etch resist, and plating the second plating layer on only a part of the first plating layer after applying the etch resist, wherein the method includes commonly removing a part of the first plating layer and a part of the base structure by etching after applying the etch resist, wherein the method includes applying an etch protection to the second plating layer before the etching;

wherein the method includes forming the first plating layer by flash plating.

11. A method, comprising:

providing a component carrier with a stack including at least one electrically conductive layer structure and at least one electrically insulating layer structure, electrically conductive wiring structures being part of the at least one electrically conductive layer structure, wherein a roughness of a horizontal surface of the electrically conductive wiring structures has an impact on a value of a passive intermodulation for signals propagating along the electrically conductive wiring structures of the component carrier, wherein the roughness of a horizontal surface of the electrically conductive wiring structures is less than 300 nm so that the value of passive intermodulation is less than −153 dBc;

wherein the electrically conductive wiring structures include an electrically conductive base structure and a plated structure on the base structure;

wherein a surface of the electrically conductive base structure below the plated structure has a roughness $R_z$ of less than 1.6 μm; and propagating a signal in the component carrier for a high-frequency application.

12. The method according to claim 11, comprising at least one of the following features:

wherein the component carrier is used for wireless communication;

wherein the component carrier is used for high-frequency applications above 1 GHz.

* * * * *